United States Patent [19]
Ternullo, Jr. et al.

[11] Patent Number: 5,796,665
[45] Date of Patent: Aug. 18, 1998

[54] SEMICONDUCTOR MEMORY DEVICE WITH IMPROVED READ SIGNAL GENERATION OF DATA LINES AND ASSISTED PRECHARGE TO MID-LEVEL

[75] Inventors: Luigi Ternullo, Jr.; Michael C. Stephens, Jr., both of San Jose, Calif.

[73] Assignee: Vanguard International Semiconductor Corporation, Hsinchu, Taiwan

[21] Appl. No.: 958,205

[22] Filed: Oct. 17, 1997

[51] Int. Cl.$^6$ ...................................... G11C 13/00
[52] U.S. Cl. ............................ 365/203; 365/154
[58] Field of Search ............... 365/203, 189.01, 365/230.01, 154

[56] References Cited

U.S. PATENT DOCUMENTS 4,272,834  6/1981  Noguchi et al. .
4,558,434  12/1985  Baba et al. .

OTHER PUBLICATIONS

*Microelectronic Circuits* 3rd Edition Sedra and Smith Saunders College Publishing, Orlando, Fla. pp. 298–317, 1991.
*Microelectronic Circuits*, 3rd ed., Adel S Sedra and Kenneth C. Smith, eds., Saunders College Publishing, Orlando, Fl. 1991, pp. 298–317.

*Primary Examiner*—Terrell W. Fears
*Attorney, Agent, or Firm*—Christensen, O'Connor, Johnson & Kindness PLLC

[57] ABSTRACT

A semiconductor memory device with a pair of data lines for reading and writing data signals to and from a matrix of memory cells and an accelerator circuit for accelerating the generation of a data signal on at least one of the data lines is disclosed. Slow signal generation on the data lines is due to the characteristics of NFET pass gates passing high signals, or PFET pass gates passing low signals. In an implementation using NFET pass gates, the accelerator circuit includes a pair of cross-coupled PFET transistors, one of which is activated by the low signal on the opposing data line. The drains of the cross-coupled PFET transistors are coupled to the data lines, such that when the low signal on the opposing data line activates one of the PFETs, it supplies additional current to the data line receiving the high signal, so as to accelerate the generation of the high signal on the data line. Faster signal generation allows for the data line latches of the circuit to be set earlier, thus allowing the read cycle of the memory device to be faster. An additional result of the increased signal generation on the data line that is receiving a high signal is that at the end of the cycle when the two data lines are coupled together, their average voltage due to charge sharing tends to be closer to a desired midlevel voltage such that less power is required to bring the two data lines to the desired mid-level voltage at the end of the signal cycle.

30 Claims, 4 Drawing Sheets

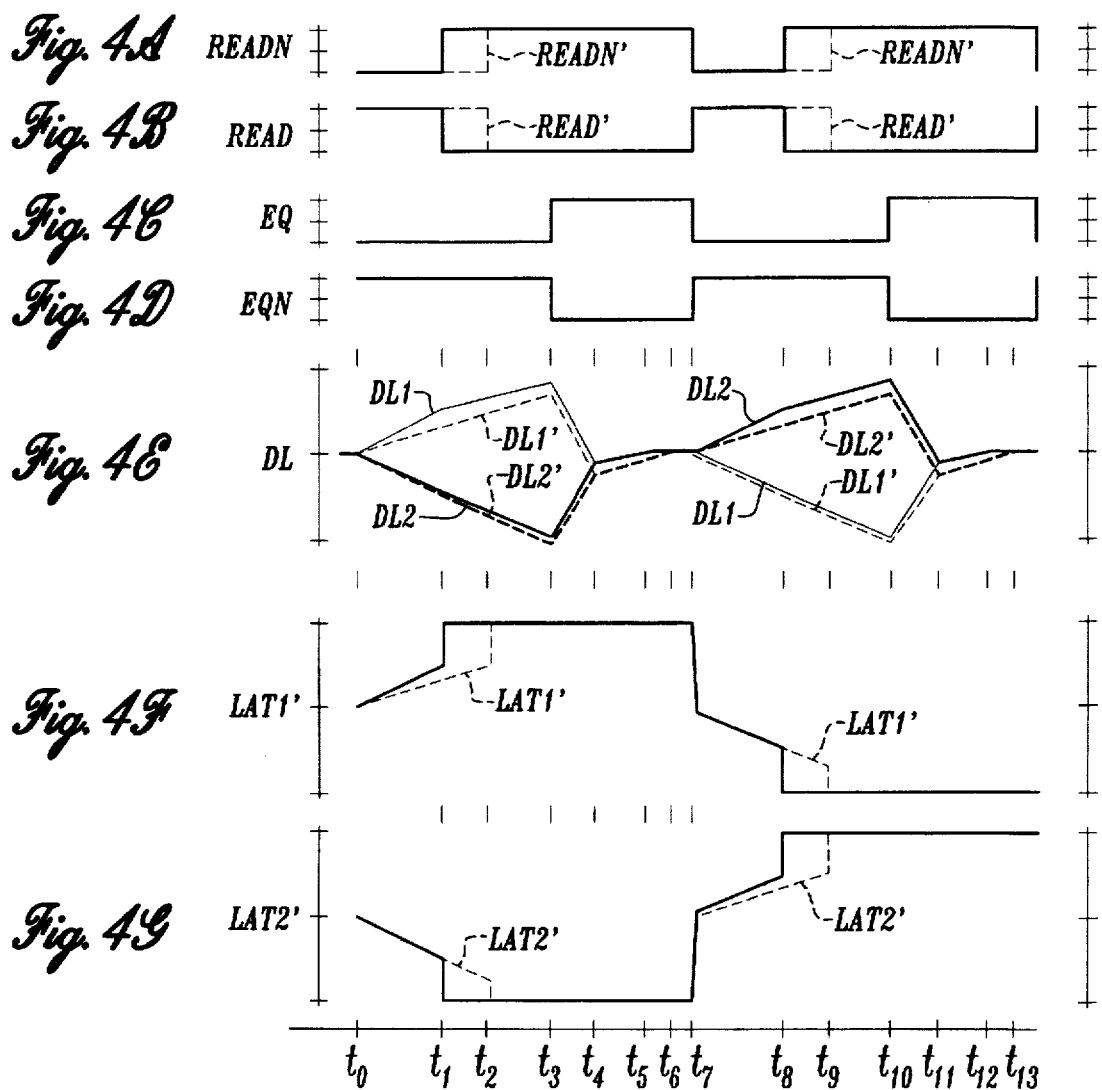

SEMICONDUCTOR MEMORY DEVICE WITH IMPROVED READ SIGNAL GENERATION OF DATA LINES AND ASSISTED PRECHARGE TO MID-LEVEL

FIELD OF THE INVENTION

This invention relates generally to semiconductor memory devices with a matrix of memory cells from which data is read out through a pair of data lines and, more particularly, to a method and apparatus for improving the read signal generation on the data lines and assisting the precharging of the data lines to a mid-level.

BACKGROUND OF THE INVENTION

In semiconductor memory devices that have a matrix of memory cells, data is usually carried to and from the memory cells through pairs of data lines. The speed with which the data can be transferred from the memory cells to the data lines determines the speed with which the semiconductor memory device can read out data. Modem semiconductor memory devices are often required to read out data very quickly, while at the same time maintaining low power usage.

An exemplary semiconductor memory device which emphasizes the need for a fast read cycle and low power usage is shown in U.S. Pat. No. 4,272,834, to Noguchi et al. Noguchi et al. discusses two factors which can cause a slow read cycle. First, the relatively high parasitic capacitance in the paired common data lines can cause the data lines to take a long time to be charged to a new signal level. Second, in devices like Noguchi et al., each of the memory cells has a reduced drive capacity for a capacitive load because the IC circuit is reduced in size for high integration and for low power consumption. As a result of these two factors, the overall time for reading out data signals becomes long. Noguchi et al. recognizes that a slow read cycle is a significant problem in semiconductor memory devices, and attempts to reduce the cycle time by setting the paired data lines to a predetermined potential in advance of when the data signals are to be read out from the memory cells. While this solution does lessen the read cycle time in devices such as Noguchi et al., it does not specifically address the slow-read problems caused by passing differential signals through field effect transistor (FET) pass gates, as discussed below.

In addition to the high parasitic capacitance and reduced drive capacity in a device designed for small size and low power as discussed in Noguchi et al., another factor that can lengthen the read cycle in a semiconductor memory device is the difficulty with passing high or low signals with field effect transistor (FET) pass gates. FIG. 1 illustrates a memory device using NFET pass gates. As illustrated in FIG. 1, NFET pass gates may be used to implement the Y-decode aspect of the read operation from the memory cells. Specifically, bit line sense amplifiers 10, 12, 14, 16, and 18 are used to amplify signals from a matrix of memory cells (not shown). Pairs of NFET pass gates 20, 22, 24, 26, and 28 are controlled by Y-decode signals Y1, Y2, Y3, Y4, and Y5 to read out signals from the bit sense amplifiers 10, 12, 14, 16, and 18, respectively. Data signals are read out onto data lines dl1 and dl2, with complementary signals existing on each line. A data line sense amplifier and supporting circuitry 32 receives the signals from the data lines dl1 and dl2. On the other side of the circuit, the semiconductor memory device has an input/output pad 42 that is coupled to an input receiver and output sense amplifier and supporting circuitry 40. The input receiver and output sense amplifier and supporting circuitry 40 is coupled to a pair of input/output lines io1 and io2. A data line latch sense amplifier and supporting circuitry 36 is also coupled to the input/output lines io1 and io2. The data line sense amplifier and supporting circuitry 32 and the data line latch sense amplifier and supporting circuitry 36 are each coupled to data latch lines dll1 and dll2. Equalizing circuits 30, 34, and 38 are used to equalize the complementary lines between each of the devices and drive them to a desired mid-potential voltage level.

One of the characteristics of the NFET pass gates 20, 22, 24, 26, and 28 is that they do not pass a high signal well. This occurs because NFET pass gates pass less current as their gate-to-source voltage decreases. Thus, when a high signal is to be passed through such a device, as the source voltage increases with the increasing signal, the gate-to-source voltage necessarily decreases assuming there is a constant gate voltage. The device then turns off when the gate-to-source voltage reaches the threshold voltage. A similar problem occurs for PFET pass gates when they attempt to pass a low signal.

This effect is increased in some embodiments where the substrate of the NFET transistors is charged to an extra-negative level. This "body-effect" as it is known in the art, causes the threshold voltage ($V_T$) of the device to increase from the typical 0.7V to a higher level, (e.g. to 1.0V or higher). This is done to decrease the potential for signal leakage through the NFET pass gates between the memory cells and bit lines (not shown). However, as described above, the highest level a signal passing through such an NFET pass gate can reach is $V_{DD}-V_T$.

As a result of these limitations of FET pass gates, latches which are set by the data line signals must be delayed, thus slowing the read cycle of the memory device. This occurs because in order for a data line latch to be set correctly, a certain amount of signal differentiation must occur on the data lines. Because this differentiation develops so slowly on a data line when a high signal is being passed through an NFET pass gate, the latch must be set at a later time.

Despite these disadvantages, NFET pass gates are still frequently used for several reasons. With regard to why NFET devices are used rather than PFET devices, NFET devices can conduct more current for a given device size. Also, while complementary FET devices might help to solve some of the above-described problems, they require more space which would be undesirable given the number of such devices normally needed in a semiconductor memory.

The present invention is directed to providing a memory device that overcomes the foregoing and other disadvantages. More specifically, the present invention is directed to a memory device that improves the read signal generation on the data lines and assists the precharging of the data lines to a mid-level voltage.

SUMMARY OF THE INVENTION

A semiconductor memory device having a pair of data lines for reading and writing data signals to and from a matrix of memory cells is disclosed. The memory device includes an accelerator circuit coupled to the data lines for improving the read signal generation on the data lines and for assisting the precharge of the data lines to a desired mid-level.

In accordance with one aspect of the invention, when data signals are being passed to the first and second data lines, the data signal on one of the data lines is used to activate the accelerator circuit so as to increase the rate of signal passing to the second data line. In one embodiment, the accelerator circuit includes a pair of cross-coupled FET transistors. If the pass gate transistors of the circuit are NFETs, then the accelerator transistors in the accelerator circuit will be PFETs, and vice versa. The pair of accelerator transistors are cross-coupled such that the gate of the first accelerator transistor is coupled to the drain of the second accelerator transistor and is also coupled to the second data line, while the gate of the second accelerator transistor is coupled to the drain of the first accelerator transistor and is also coupled to the first data line. As a result, assuming that the accelerator transistors are PFETs, when a low signal is passed to one of the data lines, it causes one of the accelerator transistors to be biased on, thereby supplying extra current to the other data line so that the generation of the complementary data signal on that data line is thereby accelerated. The acceleration of the generation of the signals on the data lines in this manner allows other devices in the semiconductor memory device, such as the latches, to be set earlier, and thus allows for a faster overall read cycle to be performed in the memory device.

In accordance with another aspect of the invention, during the read cycle when data signals are being passed to the data lines from the memory cells, the signal on the data line that has a potential that is closer to the preferred mid-level voltage is increased by the accelerator circuit so that at the end of the read cycle when the data lines are coupled together, their coupled potential due to charge sharing is closer to the preferred mid-level voltage than would have occurred had the data signal on the above-referenced data line not been increased. In addition, by using the signal on the data line that has a potential that is further from the preferred mid-level voltage to activate the accelerator circuit, a small amount of the signal on that data line is lost such that the signal on that data line is moved slightly closer to the preferred mid-level voltage. This effect also helps to move the coupled potential due to charge sharing of the two data lines closer to the preferred mid-level voltage than would have occurred had the accelerator circuit not been used. By assisting the precharge of the data lines in this manner, less energy is required to be supplied to the circuit by the mid-level voltage source, such that the overall efficiency of the semiconductor memory device is improved.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 4 is a timing diagram showing signals of the circuit of FIG. 3.

DETAILED DESCRIPTION OF THE PREFERRED EMBODIMENT

Figure 1:
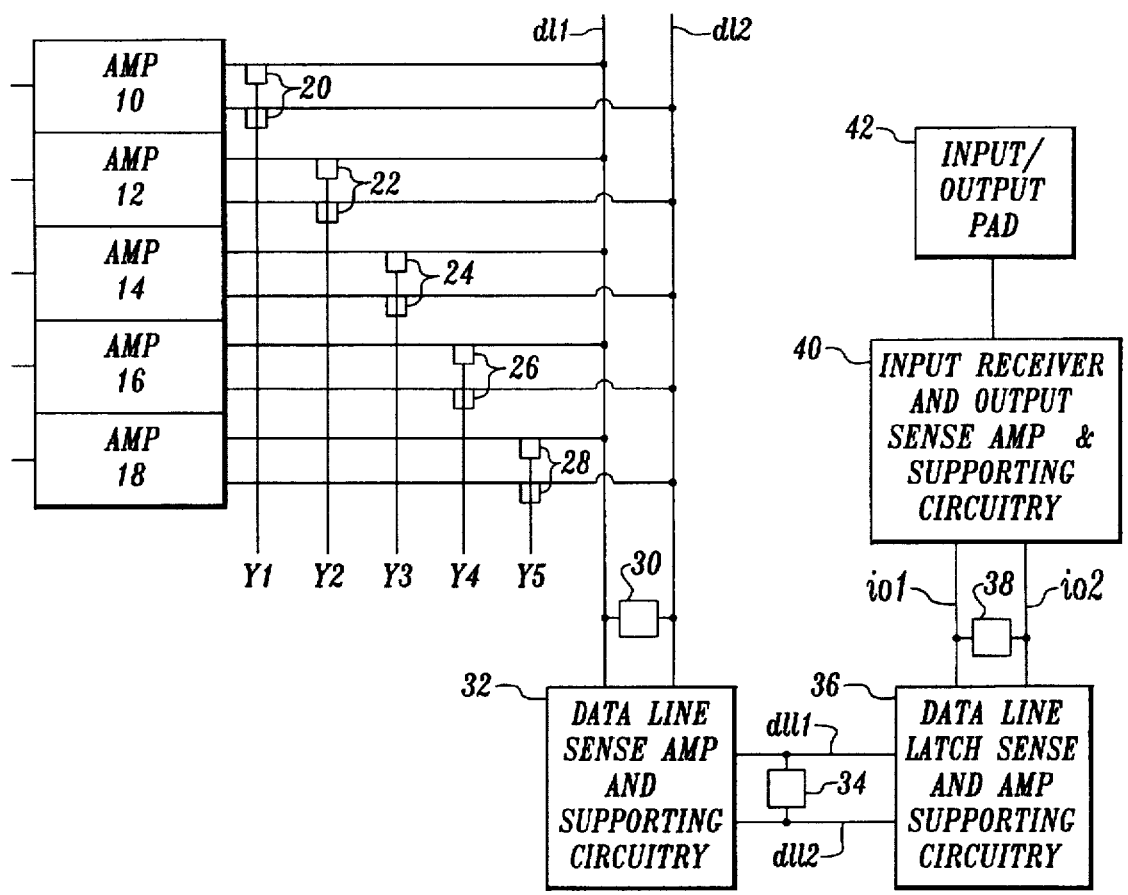
FIG. 1 is a circuit diagram of a prior art semiconductor memory device having NFET pass gates.
Figure 2:
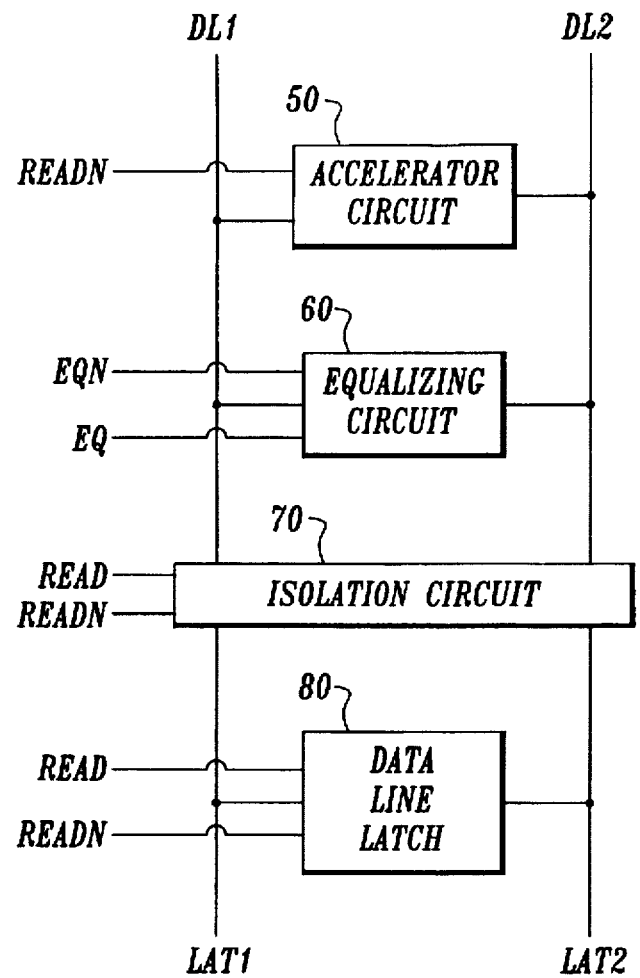
FIG. 2 is a block diagram of a portion of a semiconductor memory device having an accelerator circuit according to the present invention.

FIG. 2 is a block diagram of a portion of a semiconductor memory device having a pair of data lines and an accelerator circuit according to the present invention. Relative to the prior art circuit shown in FIG. 1, the data lines DL1 and DL2 of FIG. 2 would correspond to the data lines dl1 and dl2 of FIG. 1. The remaining circuitry shown in FIG. 2 would generally correspond to circuitry in the data line sense amplifier and supporting circuitry 32 of FIG. 1, although without the accelerator circuit 50. As shown in FIG. 2, an accelerator circuit 50 is coupled between the data lines DL1 and DL2. The accelerator circuit 50 receives a control signal READN. As is described in more detail below, the accelerator circuit 50 of the present invention uses the signal generated on one of the data lines DL1 or DL2 to accelerate the generation of the signal on the other data line DL1 or DL2.

Also coupled between the two data lines DL1 and DL2 is an equalizing circuit 60, which is controlled by control signals EQN and EQ. Equalizing circuit 60 acts similarly to equalizing circuits 30, 34, and 38 described in FIG. 1, to help bring the two data lines DL1 and DL2 to a common mid-level voltage.

The data lines DL1 and DL2 are separated from a data line latch 80 by an isolation circuit 70. Isolation circuit 70 receives control signals READ and READN. Latch lines LAT1 and LAT2 are coupled by isolation circuit 70 to the data lines DL1 and DL2, respectively. The data line latch line 80 receives control signals READ and READN. As will be described in more detail below, when the isolation circuit 70 is activated it allows signals to pass from the data lines DL1 and DL2 to the latch lines LAT1 and LAT2, respectively. Once the signals on the latch lines LAT1 and LAT2 reach a certain level, the latch is turned on which sets the latch lines at their maximum or minimum levels, and the isolation circuit 70 is turned off, which isolates the latch lines LAT1 and LAT2 from the data lines DL1 and DL2.

Figure 3:
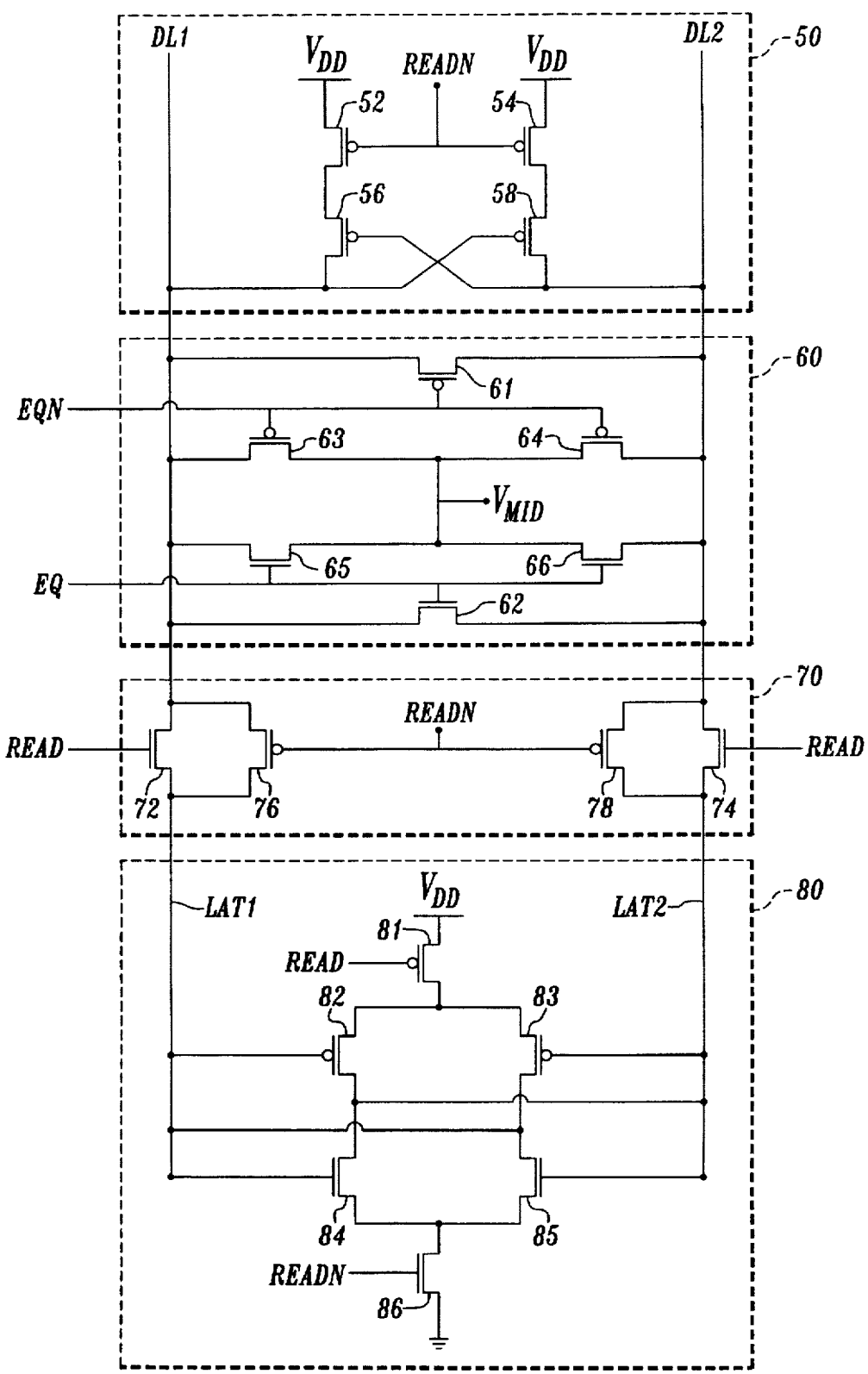
FIG. 3 is a schematic diagram of a practical implementation of the circuit of FIG. 2.

FIG. 3 shows a schematic diagram of a practical implementation of the circuit of FIG. 2. As illustrated in FIG. 3, the accelerator circuit 50 includes four PFET transistors 52, 54, 56, and 58. The sources of PFET transistors 52 and 54 are coupled to $V_{DD}$, while the gates of the transistors are both coupled to the control signal READN. The drain of PFET transistor 52 is coupled to the source of PFET transistor 56, while the drain of PFET transistor 54 is coupled to the source of PFET transistor 58. The gate of PFET transistor 56 is coupled to the drain of PFET transistor 58 and is also coupled to the data line DL2, while the gate of PFET transistor 58 is coupled to the drain of PFET transistor 56 and is also coupled to the data line DL1. The PFET transistors 56 and 58 are thus arranged in a cross-coupled formation. As will be described in more detail below, the effect of the cross-coupled formation of the PFET transistors 56 and 58 is that, during a read cycle, whichever of the data lines DL1 or DL2 goes low, the respective PFET transistor 56 or 58 is activated so as to accelerate the generation of the high signal on the opposing data line DL1 or DL2.

Further, although the first preferred embodiment shows the use of two PFET transistors 52 and 54 to control the PFET transistors 56 and 58, respectively, a single PFET transistor may be substituted. In this arrangement, the source of both PFET transistors 56 and 58 are connected to the drain of the single PFET transistor. The source of the single PFET transistor is connected to $V_{DD}$ and the gate is connected to READN. This arrangement saves valuable integrated circuit space. However, the embodiment shown in FIG. 3 allows for isolation between the data lines DL1 and DL2 during operation.

Equalizing circuit 60 includes PFET transistors 61, 63, and 64, and NFET transistors 62, 65, and 66. Although the following source and drain designations for the transistors 61–66 will be made as if the signal on data line DL1 was high and the signal on data line DL2 was low, it will be understood that the source and drain designations may be switched when opposite signals are on the two data lines. According to the present designation, PFET transistor 61 has its source coupled to data line DL1 and its drain coupled to data line DL2 and its gate coupled to control signal EQN. NFET transistor 62 has its drain coupled to data line DL1 and its source coupled to data line DL2 and its gate coupled to control signal EQ. As will be described in more detail below, PFET transistor 61 and NFET transistor 62 are used to couple the data lines DL1 and DL2 together following a read cycle when the two data lines are to be brought to a common mid-level voltage. PFET transistor 61 and NFET transistor 62 are intended to facilitate the majority of the voltage equalization on the data lines DL1 and DL2, as opposed to PFET transistors 63 and 64 and NFET transistors 65 and 66, as described below.

PFET transistor 63 has its source coupled to data line DL1 and its drain coupled to mid-level voltage source $V_{MID}$ and its gate coupled to control signal EQN. PFET transistor 64 has its source coupled to the mid-level voltage source $V_{MID}$ and its drain coupled to data line DL2 and its gate coupled to control signal EQN. NFET transistor 65 has its drain coupled to data line DL1 and its source coupled to the mid-level voltage source $V_{MID}$ and its gate coupled to control signal EQ. NFET transistor 66 has its drain coupled to the mid-level voltage source $V_{MID}$ and its source coupled to data line DL2 and its gate coupled to the control signal EQ. As will be described in more detail below, following a read cycle, the PFET transistors 63 and 64, and the NFET transistors 65 and 66, act to bring the two data lines DL1 and DL2 to the common voltage level dictated by the voltage source $V_{MID}$.

Isolation circuit 70 includes NFET transistors 72 and 74 and PFET transistors 76 and 78. The source and drain voltages for these transistors will be designated as if higher voltage signals were being passed from the data lines DL1 and DL2 to the latch lines LAT1 and LAT2, but it will be understood that an opposite flow of signals could cause opposite designations for the drains and sources. According to the present designation, NFET transistor 72 has its drain coupled to the data line DL1 and its source is coupled to the latch line LAT1 and its gate coupled to the control signal READ. NFET transistor 74 has its drain coupled to the data line DL2 and its source coupled to the latch line LAT2 and its gate coupled to the control signal READ. PFET transistor 76 has its source coupled to the data line DL1 and its drain coupled to the latch line LAT1 and its gate coupled to the NFET control signal READN. PFET transistor 78 has its source coupled to the data line DL2 and its drain coupled to the latch line LAT2 and its gate coupled to the control signal READN. As will be discussed in more detail below, when they are biased on, NFET transistors 72 and 74 and PFET transistors 76 and 78 act to pass signals from the data lines DL1 and DL2 to the latch lines LAT1 and LAT2, respectively.

Data line latch 80 includes PFET transistors 81, 82, and 83 and NFET transistors 84, 85, and 86. PFET transistor 81 has its source coupled to the supply rail $V_{DD}$, and its drain coupled to the sources of PFET transistors 82 and 83 and its gate coupled to the control signal READ. PFET transistor 82 has its drain coupled to the drain of NFET transistor 84 and also to the latch line LAT2, while its gate is coupled to latch line LAT1. PFET transistor 83 has its drain coupled to the drain of NFET transistor 85 and also to the latch line LAT1, while its gate is coupled to the latch line LAT2. NFET transistor 86 has its source coupled to the lower rail (ground) and its drain is coupled to the sources of NFET transistors 84 and 85, while its gate is coupled to the control signal READN. NFET transistor 84 has its gate coupled to the latch line LAT1, while NFET transistor 85 has its gate coupled to the latch line LAT2. Data line latch 80 is set by the signals on the data lines DL1 and DL2 and its overall function will be described in more detail below with reference to the timing diagrams of FIG. 4.

FIG. 4 shows timing diagrams for the signals of the circuit of FIG. 3. The control signals READ, READN, EQ, and EQN are generally shown to be square wave signals, with vertical transitions, although it will be generally be understood that capacitances and other factors will make the transitions more curved in nature, as is well known in the art. Also, the vertical scale of the signals has been reduced. It will be understood that the control signals READN and EQN represent inverses of the READ and EQ signals, respectively.

The signals for the data lines DL1 and DL2 are shown in a single diagram so that the relationship between the two signals can be better illustrated. The voltage scale of the timing diagrams for the data lines DL1 and DL2 and the latch lines LAT1 and LAT2 has been expanded so as to better illustrate the voltage changes occurring for those signals. Also, while the changes in the voltage levels of the signals of the data lines DL1 and DL2 and the latch lines LAT1 and LAT2 are generally shown to be linear, it will be understood that this is only for purposes of illustration and that the actual signals are typically more curved in nature, as is well known in the art.

Certain other signals are also shown in the timing diagrams to illustrate differences that would occur if the accelerator circuit 50 of the present invention was not included in the circuit of FIG. 3. These modified timing signals are illustrated with dotted lines and include READ', READN', DL1', DL2', LAT1', and LAT2'.

As illustrated in FIG. 4, at time $t_0$, the control signals READ and EQN are high and the control signals READN and EQ are low. At this time, it is assumed that a high signal begins to be passed from a sense amplifier through an NFET pass gate (not shown) to the data line DL1, and a low signal begins to similarly be passed to the data line DL2. If the accelerator circuit 50 were not present in the circuit of FIG. 3, then the signal generation would be as shown for the data lines DL1' and DL2'. As shown, the rise of the data line DL1' signal is much slower than the fall of the data line DL2' signal. This is because, as described previously, the NFET pass gate passes a high signal only very slowly. In addition, as also described previously, the data line DL1' signal will only approach a maximum voltage of $V_{DD}-V_T$, where $V_T$ represents the threshold voltage of the NFET pass gate. As stated above, due to the body effect of the substrate being extra-negatively charged so as to avoid potential signal leakage through the memory cell NFET pass gates, the threshold voltage $V_T$ of the NFET pass gates is boosted above the typical 0.7V level, for example, to the range of 0.8V to 1.2V, which contributes to the slow nature of NFET pass gates passing a high signal.

When the accelerator circuit 50 is included in the circuit of FIG. 3, the generation of the signals is illustrated by the data lines DL1 and DL2 signals. From time $t_0$ to time $t1$, the low state of control signal READN causes the PFET transistors 52 and 54 in accelerator circuit 50 to be turned on. Also, the low signal on data line DL2 turns on PFET transistor 56, so as to cause the generation of the high signal on data line DL1 to be accelerated by the additional current from the transistors 52 and 56. This acceleration is illustrated by comparing the signal on the data line DL1 to the signal on the data line DL1'. Also occurring is that the low signal on data line DL2 is slightly shifted upward as compared to the signal on data line DL2', because the PFET transistor 58 is not completely off due to the fact that the signal on data line DL1 is not up to the high $V_{DD}$ level.

Also occurring during the period from time $t_0$ to time $t_1$, the high state of control signal READ causes the NFET transistors 72 and 74 of the isolation circuit 70 to turn on, and the low state of control signal READN causes the PFET transistors 76 and 78 of the isolation circuit 70 to turn on, so that the latch lines LAT1 and LAT2 are coupled to the data lines DL1 and DL2, respectively. Thus, as illustrated in FIG. 4, during the period from time $t_0$ to time $t_1$, the signals on the latch lines LAT1 and LAT2 essentially follow the signals on the data lines DL1 and DL2, respectively.

One of the potential benefits of the accelerator circuit 50 being used to accelerate the generation of the signal on the data line DL1 during the period from time $t_0$ to time $t_1$ can be better understood with reference to the signal on data line DL1' during the period from time $t_1$ to time $t_2$. One of the advantages of accelerating the generation of the signal on the data line DL1 is that it gives greater signal differentiation more quickly so that the data line latch 80 can be set earlier. As illustrated in FIG. 4, at time $t_1$, the data line DL1 has reached a desired voltage level for setting latch 80. This being the case, the control signal READ is set to go low at time $t_1$, thus setting the latch. In contrast, the signal on the data line DL1', which illustrates the signal generation if the accelerator circuit 50 were not present, does not reach the desired voltage level for setting the latch until time $t_2$. Thus, the control signal READ' is not designed to go low so as to set the latch until time $t_2$. As a result, the latch signals LAT1' and LAT2' are not set, and do not go to their maximum high or low states until time $t_2$. Thus, it is illustrated that the accelerator circuit 50 accelerates the generation of the signal on the data line DL1, so that latch 80 can be set earlier, thus allowing a faster overall read operation for the memory device.

When the accelerator circuit 50 is included in the circuit of FIG. 3, the control signal READ goes low and control signal READN goes high at time $t_1$. This causes PFET transistors 52 and 54 in the accelerator circuit 50 to be shut off As a result, from time $t_1$ to time $t_3$, the signal on the data line DL1, which is no longer being accelerated by the accelerator circuit 50, returns to the normal signal generation that is induced by the high signal that is being passed through the NFET pass gate (not shown), similar to the signal that is generated on the data line DL1'. The signal on the data line DL2 is relatively unaffected by the control signal READ going low, because it was not being accelerated by the accelerator circuit 50.

Also occurring at time $t_1$, when the control signal READ goes low and the signal READN goes high, the NFET transistors 72 and 74 and the PFET transistors 76 and 78 of isolation circuit 70 are turned off, thus isolating the data lines DL1 and DL2 from the latch lines LAT1 and LAT2. Also, PFET transistor 81 and NFET transistor 86 in the data line latch 80 are turned on, so that the latch is thereby set in the following manner.

Due to some level of parasitic capacitance being present on the latch lines LAT1 and LAT2, the latch lines LAT1 and LAT2 hold the signal that was previously coupled from the data lines DL1 and DL2 so that at time $t_1$, the latch is set by the previously coupled signals. If insufficient parasitic capacitances were present, the control signals could be slightly altered, so as to allow the latch to be directly set by the signals coupled from the data lines DL1 and DL2. As shown in FIG. 4, at time $t_1$, the high signal on the latch line LAT1 causes NFET transistor 84 to turn on, which in combination with the NFET transistor 86 that was turned on by the control signal READN causes the voltage of the drain of NFET transistor 84 to go low so that latch line LAT2 is driven low. Also at time $t_1$, the low signal on the latch line LAT2 causes PFET transistor 83 to turn on such that, in combination with PFET transistor 81 that was turned on by the control signal READ, the signal at the drain of PFET transistor 83 is caused to go high such that the latch line LAT1 is driven high. With latch line LAT2 driven low, and latch line LAT1 driven high, the latch has thus been set by the data received previously from the data lines DL1 and DL2.

At time $t_3$, the control signal EQ goes high and the control signal EQN goes low. This causes the PFET transistors 61, 63, and 64, and the NFET transistors 62, 65, and 66 in the equalizing circuit 60 to be turned on. As was described earlier, the equalizing circuit 60 is designed to bring the data lines DL1 and DL2 to a common mid-level voltage as dictated by the voltage source $V_{MID}$. As part of this process, the PFET transistor 61 and the NFET transistor 62 are intended to accomplish most of the voltage change on the data lines DL1 and DL2 by coupling the two lines together so that they are brought to a common voltage by charge sharing. This is the preferred method for most of the voltage change, because it does not require any additional energy to be applied to the circuit. In contrast, when the voltage source $V_{MID}$ is used to change the voltage level of the data lines, it must apply energy to the circuit, thus increasing the power usage of the memory device.

At time $t_4$, once the PFET transistor 61 and the NFET transistor 62 have allowed charge sharing between the data lines DL1 and DL2 to bring the data lines to a common voltage level, the PFET transistors 63 and 64 and NFET transistors 65 and 66 of the equalization circuit 60 act to bring both of the data lines DL1 and DL2 up to the desired mid-level voltage as dictated by the mid-level supply $V_{MID}$. Thus, during the period from time $t_4$ to time $t_5$, the data lines DL1 and DL2 are brought to the desired mid-level voltage dictated by the voltage source $V_{MID}$. The data lines DL1' and DL2', which would average to a lower voltage level at time $t_4$, require more energy and more time to be brought up to the desired midlevel voltage as is seen at time $t_6$.

The fact that the data lines DL1' and DL2' require more energy to be brought to the desired mid-level emphasizes an additional advantage of the accelerator circuit 50 as it was used during the period from time $t_0$ to time $t_1$. As can be seen in FIG. 4, because the accelerator circuit 50 caused the data line DL1 to have an accelerated signal generation as compared to the data line DL1' during the period from time $t_0$ to time $t_1$, when the signal generation reaches its peak on the data lines at time $t_3$, the signal on data line DL1 is higher than the signal on data line DL1'. Also, although the use of the signal on the data line DL2 to activate PFET transistor 56 in the accelerator circuit 50 caused a small decrease in signal generation on the data line DL2 as compared to the data line DL2', the result is that the signal on the data line DL2 is slightly higher than the signal on data line DL2' at time $t_3$. As a result of these effects, when the data lines DL1 and DL2 are tied together by the equalization circuit 60 at time $t_3$, they average to a level at time $t_4$ that is closer to the desired mid-level than do the data lines DL1' and DL2'. This produces the very important result that the tied data lines DL1 and DL2 require less energy from the mid-level voltage source of $V_{MID}$ to bring the data lines to the mid-level voltage at time $t_5$. In contrast, the data lines DL1' and DL2' require more energy to be brought to the mid-level, and do not reach the mid-level until time $t_6$. Thus, the use of the accelerator circuit 50 has in effect reduced the energy that is later required from the mid-level voltage source $V_{MID}$ to bring the data lines to the desired mid-level.

At time $t_7$, the cycle essentially starts over again when the control signals READ and EQN go high and the control signals READN and EQ go low. At this time, it is assumed that a high signal is now being passed to the data line DL2 from a sense amplifier through an NFET pass gate (not shown) and that a low signal is now similarly being passed to data line DL1. Because the control signal READN is low, PFET transistors 52 and 54 in the accelerator circuit 50 are turned on. The low signal being passed to data line DL1 causes PFET transistor 58 to be turned on, such that, in combination with PFET transistor 54, the generation of the high signal on data line DL2 is accelerated by the extra current being provided. Thus, as shown in FIG. 4, during the period from time $t_7$ to time $t_8$, the signal on the data line DL2 is rising faster than the signal on data line DL2'. Also, the low signal on data line DL1 is slightly shifted upward because the PFET transistor 56 is not completely off due to the fact that the signal on data line DL2 is not up to the high $V_{DD}$ level.

Also at time $t_7$, the control signal READ going high and the control signal READN going low causes the NFET transistors 72 and 74 and the PFET transistors 76 and 78 in the isolation circuit 70 to be turned on. This causes the data lines DL1 and DL2 to be coupled to the latch lines LAT1 and LAT2, respectively. Also, the PFET transistor 81 and the NFET transistor 86 are turned off, thus effectively turning off the latch 80. As a result, the latch line LAT1, which was previously at a high up until time $t_7$, is now quickly pulled down to the level of the data line DL1, and then follows the voltage changes on data line DL1. Similarly, latch line LAT2, which was at a low up until time $t_7$, is caused to be pulled up to the level of data line DL2, and then follows the voltage changes on data line DL2.

At time $t_8$, the control signal READ goes low and the control signal READN goes high which, as described earlier, causes the accelerator circuit 50 to be shut off and the latch 80 to be set, thus causing the latch line LAT1 to go low and the latch line LAT2 to go high. At time $t_{10}$, control signal EQ goes high and control signal EQN goes low, thus activating the equalizing circuit 60, which causes the data lines DL1 and DL2 to be coupled together. At time $t_{11}$, it is again shown that the average voltage level of the data lines DL1 and DL2, as a result of charge sharing through the PFET transistor 61 and the NFET transistor 62, is closer to the desired mid-level voltage than the voltage level of the data lines DL1' and DL2'. At time $t_{12}$, the data lines DL1 and DL2 have been brought up to the desired mid-level potential, while it takes until time $t_{13}$ for the data lines DL1' and DL2' to be brought to that level.

Thus, as shown above, use of the accelerator circuit 50 has distinct advantages. Specifically, the acceleration of the generation of the signals on the data lines allows the latches to be set earlier, and thus allows for a faster read cycle to be performed in the memory device. Also, at the end of the cycle when the data lines are to be brought to a desired mid-level voltage, the earlier acceleration of the signals on the data lines causes the average of the signals on the data lines at the end of the cycle to be closer to the desired mid-level voltage, so that less energy and less time is then required to bring the data lines to the desired mid-level voltage.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A semiconductor memory device for storing data, the semiconductor memory device comprising:
   first and second data lines for carrying complementary data signals, the data signals being generated on the data lines during a signal cycle; and
   an accelerator circuit, the accelerator circuit being coupled to the first and second data lines, the accelerator circuit being activated by a first data signal that is generated on the first data line during a signal cycle, the accelerator circuit when activated accelerating the generation of a second data signal on the second data line.

2. The semiconductor memory device of claim 1, wherein the accelerator circuit comprises a first accelerator transistor with a gate, the first accelerator transistor being coupled to the second data line and the gate of the first accelerator transistor being coupled to the first data line, the transistor being biased on by the first data signal that is generated on the first data line during the signal cycle so as to cause the transistor to accelerate the generation of the second data signal on the second data line.

3. The semiconductor memory device of claim 2, further comprising an array of memory cells and a plurality of pass gate transistors, the pass gate transistors passing data signals from the memory cells to the first and second data lines, the pass gate transistors each having a gate, a source, a drain, and a channel, the channels of the pass gate transistors being of a first polarity, the first accelerator transistor of the accelerator circuit also having a gate, a source, a drain, and a channel, the channel of the first accelerator transistor being of a second polarity that is opposite to the polarity of the channels of the plurality of pass gate transistors.

4. The semiconductor memory device of claim 3, wherein the plurality of pass gate transistors are NFETs and the accelerator transistor is a PFET.

5. The semiconductor memory device of claim 3, wherein the accelerator circuit further comprises a second accelerator transistor, the second accelerator transistor having a gate, a source, a drain, and a channel, the channel of the second accelerator transistor being of the same second polarity as the channel of the first accelerator transistor, the gate of the second accelerator transistor being coupled to the second data line and also being coupled to the drain of the first accelerator transistor, the gate of the first accelerator transistor being coupled to the drain of the second accelerator transistor.

6. The semiconductor memory device of claim 1, wherein at the end of the signal cycle the first and second data lines are coupled together and brought to a preferred voltage level, wherein at the end of the signal cycle the voltage level on the first and second data lines due to charge sharing is closer to the preferred voltage level than the voltage level due to charge sharing would have been on the first and second data lines had the accelerator circuit not been present.

7. The semiconductor memory device of claim 1, wherein at the end of the signal cycle the first and second data lines are coupled together and brought to a preferred voltage level by a mid-level voltage source, wherein at the end of the signal cycle the mid-level voltage source is required to supply less energy to bring the data lines to the preferred voltage level than would have been required had the accelerator circuit not been present.

8. The semiconductor memory device of claim 2, wherein the source of said first accelerator transistor is connected to a bias voltage $V_{DD}$ through a first gating transistor that is controlled by a signal READN.

9. The semiconductor memory device of claim 5, wherein the source of said first accelerator transistor is connected to a bias voltage $V_{DD}$ through a first gating transistor that is controlled by a signal READN, and wherein the source of said second accelerator transistor is connected to said bias voltage $V_{DD}$ through a second gating transistor that is controlled by said signal READN.

10. The semiconductor memory device of claim 5, wherein the source of said first accelerator transistor and said second accelerator transistor is connected to a bias voltage $V_{DD}$ through a first gating transistor that is controlled by a signal READN.

11. A semiconductor memory device for storing data, the semiconductor memory device comprising:
    first and second data lines for carrying complementary data signals, the data signals being generated on the data lines during a signal cycle; and
    an accelerator circuit, the accelerator circuit comprising a first accelerator transistor with a gate, the transistor being coupled to the second data line and the gate of the transistor being coupled to the first data line, the transistor being biased on by a signal on the first data line so as to accelerate the generation of a signal on the second data line.

12. The semiconductor memory device of claim 11, further comprising an array of memory cells and a plurality of pass gate transistors, the pass gate transistors passing data signals from the memory cells to the first and second data lines, the pass gate transistors each having a gate, a source, a drain, and a channel, the channels of the pass gate transistors being of a first polarity, the first accelerator transistor of the accelerator circuit also having a source, a drain, and a channel, the channel of the first accelerator transistor being of a second polarity that is opposite to the polarity of the channels of the plurality of pass gate transistors.

13. The semiconductor memory device of claim 12, wherein the pass gate transistors are NFETs and the accelerator transistor is a PFET.

14. The semiconductor memory device of claim 12, wherein the accelerator circuit further comprises a second accelerator transistor, the second accelerator transistor having a gate, a source, a drain, and a channel, the channel of the second accelerator transistor being of the same second polarity as the channel of the first accelerator transistor, the gate of the second accelerator transistor being coupled to the second data line and also being coupled to the drain of the first accelerator transistor, the gate of the first accelerator transistor being coupled to the drain of the second accelerator transistor.

15. The semiconductor memory device of claim 11, wherein at the end of the signal cycle the first and second data lines are coupled together and brought to a preferred voltage level, wherein at the end of the signal cycle the voltage level that the first and second data lines average to due to charge sharing is closer to the preferred voltage level than the average voltage level due to charge sharing would have been on the first and second data lines had the accelerator circuit not been present.

16. The semiconductor memory device of claim 11, wherein the source of said first accelerator transistor is connected to a bias voltage $V_{DD}$ through a first gating transistor that is controlled by a signal READN.

17. The semiconductor memory device of claim 14, wherein the source of said first accelerator transistor is connected to a bias voltage $V_{DD}$ through a first gating transistor that is controlled by a signal READN, and wherein the source of said second accelerator transistor is connected to said bias voltage $V_{DD}$ through a second gating transistor that is controlled by said signal READN.

18. The semiconductor memory device of claim 14, wherein the source of said first accelerator transistor and said second accelerator transistor is connected to a bias voltage $V_{DD}$ through a first gating transistor that is controlled by a signal READN.

19. A semiconductor memory device for storing data, the semiconductor memory device comprising:
    an array of memory cells;
    a pair of data lines for carrying data to and from the memory cells;
    a plurality of pass gate transistors, each pass gate transistor having a gate, a drain, a source, and a channel, the channels of the pass gate transistors being of the same polarity, the pass gate transistors passing data from the memory cells to the data lines; and
    an accelerator circuit, the accelerator circuit comprising first and second accelerator transistors, the accelerator transistors each having a gate, a drain, a source, and a channel, the channels of the accelerator transistors being of a polarity that is opposite to the polarity of the channels of the pass gate transistors, the gate of the first accelerator transistor being coupled to the drain of the second accelerator transistor and also coupled to the second data line, the gate of the second accelerator transistor being coupled to the drain of the first accelerator transistor and also coupled to the first data line.

20. The semiconductor memory device of claim 19, wherein the pass gate transistors each have a threshold voltage, wherein the pass gate transistors pass high and low data signals, one of the high or low data signals being passed a level that is limited to the level received at the pass gate transistor less the threshold voltage of the pass gate transistor, the generation of the so-limited data signal when received on one of the first or second data lines being accelerated by the accelerator circuit.

21. The semiconductor memory device of claim 19, wherein the source of said first accelerator transistor is connected to a bias voltage $V_{DD}$ through a first gating transistor that is controlled by a signal READN, and wherein the source of said second accelerator transistor is connected to said bias voltage $V_{DD}$ through a second gating transistor that is controlled by said signal READN.

22. The semiconductor memory device of claim 19, wherein the source of said first accelerator transistor and said second accelerator transistor is connected to a bias voltage $V_{DD}$ through a first gating transistor that is controlled by a signal READN.

23. A semiconductor memory device for storing data, the semiconductor memory device comprising:
    first and second data lines for carrying complementary data signals, the data signals being generated on the data lines during a signal cycle, the first and second data lines being coupled together and brought to a preferred voltage level at the end of a signal cycle; and
    an accelerator circuit, the accelerator circuit being used to increase the generation of a data signal on at least one of the data lines, the signal on the data line being increased such that at the end of the signal cycle when the data lines are coupled together, the voltage level on the first and second data lines due to charge sharing is closer to the preferred voltage level than the voltage level due to charge sharing on the date lines would have been had the accelerator circuit not been present.

24. The semiconductor memory device of claim 23, further comprising a mid-level voltage source, the mid-level voltage source at the end of the signal cycle supplying energy to bring the first and second data lines to the preferred voltage level, the mid-level voltage source being required to supply less energy to bring the first and second data lines to the preferred voltage level than would have been necessary had the accelerator circuit not been present.

25. The semiconductor memory device of claim 23, further comprising a mid-level voltage source, the mid-level voltage source requiring a certain amount of time to bring the first and second data lines to the preferred voltage level, the mid-level voltage source requiring less time to bring the first and second data lines to the preferred voltage level than would have been required had the accelerator circuit not been present.

26. The semiconductor memory device of claim 23, wherein the accelerator circuit comprises a first accelerator transistor with a gate, the first accelerator transistor being coupled to the second data line and the gate of the first accelerator transistor being coupled to the first data line, the transistor being biased on by the first data signal that is generated on the first data line during the signal cycle so as to accelerate the generation of a second data signal on the second data line.

27. The semiconductor memory device of claim 26, wherein the source of said first accelerator transistor is connected to a bias voltage $V_{DD}$ through a first gating transistor that is controlled by a signal READN.

28. A semiconductor memory device for storing data, the semiconductor memory device comprising:

first and second data lines for carrying data signals, the data signals being generated on the data lines during a signal cycle, the first and second data lines being coupled together at the end of a signal cycle;

a mid-level voltage source, the mid-level voltage source at the end of a signal cycle supplying energy to bring the first and second data lines to a preferred voltage level; and an accelerator circuit, the accelerator circuit being used to increase the generation of a data signal on at least one of the data lines, the signal on the data line being increased such that at the end of the signal cycle when the data lines are coupled together the mid-level voltage source is required to supply less energy to bring the first and second data lines to the preferred voltage level than would have been required had the accelerator circuit not been present.

29. The semiconductor memory device of claim 28, wherein the accelerator circuit comprises a first accelerator transistor with a gate, the first accelerator transistor being coupled to the second data line and the gate of the first accelerator transistor being coupled to the first data line, the transistor being biased on by the first data signal that is generated on the first data line during the signal cycle so as to accelerate the generation of a second data signal on the second data line.

30. The semiconductor memory device of claim 28, wherein the source of said first accelerator transistor is connected to a bias voltage $V_{DD}$ through a first gating transistor that is controlled by a signal READN.

* * * * *